US008883620B1

(12) United States Patent
Sinha et al.

(10) Patent No.: US 8,883,620 B1
(45) Date of Patent: Nov. 11, 2014

(54) METHODS FOR USING ISOTOPICALLY ENRICHED LEVELS OF DOPANT GAS COMPOSITIONS IN AN ION IMPLANTATION PROCESS

(71) Applicants: Ashwini K. Sinha, East Amherst, NY (US); Ching I Li, Tainan (TW)

(72) Inventors: Ashwini K. Sinha, East Amherst, NY (US); Ching I Li, Tainan (TW)

(73) Assignee: Praxair Technology, Inc., Danbury, CT (US)

( * ) Notice: Subject to any disclaimer, the term of this patent is extended or adjusted under 35 U.S.C. 154(b) by 0 days.

(21) Appl. No.: 13/869,456

(22) Filed: Apr. 24, 2013

(51) Int. Cl.
*H01L 21/425* (2006.01)
*H01L 21/265* (2006.01)
*H01J 27/02* (2006.01)

(52) U.S. Cl.
CPC ............ *H01L 21/265* (2013.01); *H01J 27/02* (2013.01)
USPC . 438/514; 250/424; 250/492.2; 257/E21.334; 257/E21.473; 438/515

(58) Field of Classification Search
USPC ........ 250/424, 492.2; 257/E21.334, E21.473; 438/524, 515
See application file for complete search history.

(56) References Cited

U.S. PATENT DOCUMENTS

| 5,937,895 A | 8/1999 | LeFebre et al. |
| 6,007,609 A | 12/1999 | Semerdjian et al. |
| 6,045,115 A | 4/2000 | Martin, Jr. et al. |
| 7,708,028 B2 | 5/2010 | Brown et al. |
| 7,905,247 B2 | 3/2011 | Campeau |
| 2002/0100876 A1* | 8/2002 | Murakoshi et al. ............ 250/424 |
| 2012/0142174 A1* | 6/2012 | Kaim et al. .................... 438/513 |

* cited by examiner

*Primary Examiner* — Asok K Sarkar
*(74) Attorney, Agent, or Firm* — Nilay S. Dalal

(57) ABSTRACT

A novel process for using enriched and highly enriched dopant gases is provided herein that eliminates the problems currently encountered by end-users from being able to realize the process benefits associated with ion implanting such dopant gases. For a given flow rate within a prescribed range, operating at a reduced total power level of the ion source is designed to reduce the ionization efficiency of the enriched dopant gas compared to that of its corresponding non-enriched or lesser enriched dopant gas. The temperature of the source filament is also reduced, thereby mitigating the adverse effects of fluorine etching and ion source shorting when a fluorine-containing enriched dopant gas is utilized. The reduced levels of total power in combination with a lower ionization efficiency and lower ion source temperature can interact synergistically to improve and extend ion source life, while beneficially maintaining a beam current that does not unacceptably deviate from previously qualified levels.

20 Claims, 2 Drawing Sheets

Schematic of an ion source apparatus

Schematic of an ion source apparatus

METHODS FOR USING ISOTOPICALLY ENRICHED LEVELS OF DOPANT GAS COMPOSITIONS IN AN ION IMPLANTATION PROCESS

FIELD OF THE INVENTION

The present invention relates to a novel process for utilizing enriched and highly enriched levels of dopant gases for ion implantation processes.

BACKGROUND OF THE INVENTION

Ion implantation is an important process in semiconductor/microelectronic manufacturing. The ion implantation process is used in integrated circuit fabrication to introduce dopant impurities into semiconductor wafers. An ion-source is used to generate a well-defined ion beam for a variety of ion species from a dopant gas. Ionization of the dopant gas generates the ion species which can be subsequently implanted into a given workpiece.

Isotopically enriched dopant gases have emerged as widely used dopant gas precursors in the semiconductor industry. As used herein and throughout the specification, the terms "isotopically enriched" and "enriched" dopant gas are used interchangeably to mean the dopant gas contains a distribution of mass isotopes different from the naturally occurring isotopic distribution, whereby one of the mass isotopes has an enrichment level higher than present in the naturally occurring level. By way of example, 58% 72GeF4 refers to an isotopically enriched or enriched dopant gas containing mass isotope 72Ge at 58% enrichment, whereas naturally occurring GeF4 contains mass isotope 72Ge at 27% natural abundance levels.

By using a dopant gas at a given flow rate that is enriched in a desired atomic species to be implanted, an ion beam is produced with higher beam current in comparison with a corresponding non-enriched dopant gas utilized at the same flow rate. As an example, for a given flow rate, 58% 72GeF4 enriched in mass isotope 72Ge at 58% enrichment can produce a beam current twice as high as a beam current produced with naturally occurring GeF4 having mass isotope 72Ge at 27% natural abundance levels. In other words, twice as many 72Ge ions are generated in the ion chamber per unit volume of flow rate when utilizing 58% 72GeF4 as compared to naturally occurring GeF4. In addition to higher beam current, the enriched dopant gas allows the ability to achieve the required implant dosage of the desired atomic species utilizing less dopant gas compared to the corresponding non-enriched dopant gas.

Such process benefits are particularly advantageous when the enriched dopant gas is a fluorine-containing gas, which is well known to etch walls of a tungsten ion chamber and form tungsten fluoride (WFx) species that can migrate to the hot source filament where tungsten can be deposited. The tungsten deposits can cause momentary drops in beam current known as glitching or arc discharge. Ultimately the ion source performance may deteriorate and degrade over time when the glitching and/or frequency of glitching reaches an upper threshold such that the ion apparatus cannot operate with acceptable efficiency. In such a scenario, the user must stop the implant operation and perform maintenance to clean the deposits or replace the ion source. Such downtime results in productivity loss of the ion implantation system. Consequently, the ability to achieve the required implant dosage of the desired atomic species by using a correspondingly enriched fluorine-containing dopant gas can introduce less fluorine into the ion source chamber, thereby reducing tungsten deposits and potentially extending ion source life.

Furthermore, use of various enriched dopant gases at the same flow rate as its non-enriched dopant gas offers the advantage of increased throughput and yield. More dopant atomic species are available for implantation per unit flow of enriched dopant gas, as compared to its non-enriched dopant analog. As a result, the potential for productivity and yield increases when enriched dopant gases are utilized.

In addition, isotopic enrichment of a desired atomic species to a sufficient level for producing the required ion implant dosage can eliminate cross-contamination problems with other species. Today, many of the ion source tools are non-dedicated, meaning that several different atomic species are implanted using the same tool. By way of example, naturally occurring or non-enriched germanium tetrafluoride (GeF4) has been used for implanting 74Ge ionic species because it is the most abundant at 37% in naturally occurring GeF4 (i.e., GeF4) compared to the other stable isotopes of GeF4 (i.e., 70Ge, 72Ge, 73Ge and 76Ge). Many of these source tools also process and implant 75As, which creates cross-contamination problems with 74Ge, as the ion magnetic separator does not recognize the difference between the two atomic species by virtue of only a 1 atomic mass unit (a.m.u.) difference between the 75As and 74Ge species. In other words, the ion source chamber cannot resolve or filter the residual 75As in the resultant ion beam from previous production runs, as the mass resolution of conventional beams are not capable of recognizing the difference in 74Ge and 75As atomic species. As a result, both 74Ge and 75Ge species can be inadvertently implanted into a workpiece, thereby rendering the microelectronic device contaminated and potentially not fit for its intended purpose. It has been shown that contamination can reach 6% or higher of the intended germanium dose.

To alleviate such cross-contamination, it has been recognized that isotopically enriched Ge atomic species that are 2 or more a.m.u. away from 75As can be utilized. As such, isotopic enrichment of naturally occurring GeF4 in 72Ge can raise the concentration of 72GeF4 whereby the mass 72 germanium isotope is enriched from its natural abundance level of 27% to about 52% or higher such that the required Ge dosage can occur without 75 As cross-contamination. The enriched levels of 72GeF4 achieve the required dosage in a manner that introduces less overall gas. Additionally, less consumption of the enriched 72GeF4 also translates into less fluorine ions available for etching chamber components and depositing tungsten onto source filaments.

Such process benefits have prompted users such as semiconductor fabs and foundaries to replace conventional non-enriched dopant gases in their ion implant processes with corresponding enriched and highly enriched dopant gas analogs. Generally speaking, in the microelectronics industry, because the ion source tools have previously been qualified to operate at established processing parameters demonstrating the ability to precisely and reliably produce acceptable wafers with the required implant dosage, the ion implantation processing parameters preferably are to remain unchanged when utilizing the corresponding enriched dopant gases.

However, notwithstanding the above mentioned process benefits, semiconductor fabs and foundaries are encountering difficulties using the enriched dopant gas analogs in a manner that does not significantly depart from the previously qualified operating parameters of the ion source tool. In particular, operating the ion source tool at the same flow rate of enriched dopant gas as previously used with the non-enriched or lesser enriched dopant gas increases the beam current to a level that represents a departure from the qualified ion beam current. As a result, the entire ion implantation process must be re-qualified, which is a time consuming process effectively amounting to unacceptable production downtime. Additionally, the increased ion beam current is particularly problematic for enriched fluorine-containing dopant gases in which the ionization of the enriched dopant gas produces a large amount of free available fluoride ions that can form various ionic species of tungsten fluoride (WFx). As mentioned, WFx species tend to migrate to hotter surfaces in the ion source chamber, including the cathode or source filament, where they can deposit tungsten and potentially cause glitching and short the ion source. As tungsten deposits, the atomic or molecular fluorine is released and is available to continue the so-called "halogen cycle" of etching additional tungsten walls. As a result, end-users are observing that employing a fluorine-containing enriched gas may in some instances shorten source life by accelerating the halogen cycle.

The aforementioned problems are potentially compounded when utilizing higher levels of enriched dopant gases. Accordingly, ion implant users may not be achieving the process benefits of isotopically enriched dopant gases originally intended. There is an unmet need for an ion implantation process that can realize the process benefits of utilizing enriched dopant gases that eliminates the aforementioned problems.

SUMMARY OF THE INVENTION

In a first aspect, a method of using an enriched dopant gas is provided, comprising: introducing the enriched dopant gas at a flow rate sufficient to maintain stability of the ion source, wherein the enriched dopant gas has an enrichment level in an isotope therein of 90% or greater than natural abundance levels; operating at a reduced total power level of the ion source in comparison to a power level utilized for the corresponding lesser enriched or non-enriched dopant gas at the flow rate; and ionizing the dopant gas to generate and maintain a beam current as produced using the corresponding lesser enriched or non-enriched dopant gas at the flow rate.

In a second aspect, a method of using an enriched dopant gas is provided, comprising: introducing the enriched dopant gas at a flow rate in a range of 1-5 sccm, wherein the enriched dopant gas consists essentially of 72GeF4 having an enrichment level in an isotope of 72Ge greater than 55%; operating at a reduced total power level of the ion source in comparison to a total power level utilized for a correspondingly lesser enriched or non-enriched dopant gas W; operating at a reduced temperature of the ion source in comparison to the corresponding lesser enriched or non-enriched dopant gas at the flow rate; and ionizing the enriched dopant gas to achieve and maintain a beam current as produced using the corresponding lesser enriched or non-enriched dopant gas at the flow rate.

In a third aspect, a method for using an isotopically enriched dopant gas for an ion implant process, comprising the steps of: selecting a dopant gas having an atomic species to be implanted into a wafer; selecting a mass isotope of said dopant gas to be enriched at least 90% above natural abundance levels therein; providing the mass isotope of said dopant gas in a subatmospheric storage and delivery container; introducing the mass isotope of dopant gas at a flow rate sufficient to maintain stability of the ion source; operating at a reduced power level of the ion source in comparison to a power level utilized for the corresponding lesser enriched or non-enriched dopant gas; and ionizing the dopant gas to maintain a beam current as produced using a corresponding lesser enriched or non-enriched dopant gas at the flow rate.

BRIEF DESCRIPTION OF THE DRAWINGS

The above and other aspects, features, and advantages of the present invention will be more apparent from the following, more detailed description thereof, presented in conjunction with the following drawings, wherein.

DETAILED DESCRIPTION OF THE INVENTION

Figure 1:
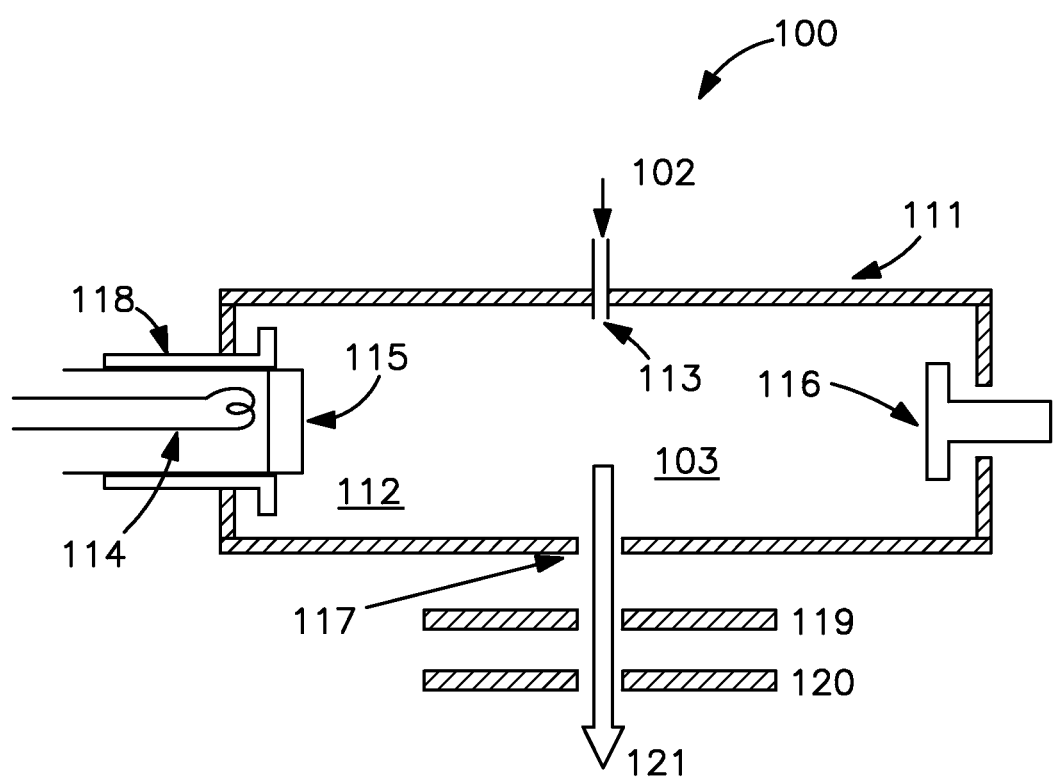
FIG. 1 shows an ion source apparatus incorporating the principles of the present invention.

As used herein, unless indicated otherwise, all concentrations are expressed as volumetric percentages ("vol %").

Although it has been recognized that one of the advantages of using isotopically enriched dopant gases is the reduction of the overall flow of gas in comparison to non-enriched dopant gases to achieve similar beam currents, limitations exist for utilization of the enriched dopant gases. Attempts to reduce the flow rate of the enriched dopant gas to maintain the qualified ion beam current levels may not be possible because the necessary reduction in dopant gas flow rate destabilizes the ion source such that the plasma cannot be maintained. Accordingly, the ion beam current level cannot remain within an acceptable qualified range when utilizing the enriched dopant gas analog at reduced flow rates.

The present invention also recognizes that lowering the flow rate of isotopically enriched dopant gases beyond a predetermined threshold causes the ion tool to destabilize, whereby the pressure in the chamber reduces beyond a critical threshold. The reduced pressure means insufficient collisions between electrons and the dopant gases are occurring to sustain the plasma and operate the ion source in an arc discharge mode. In other words, the mean free path for collision between electrons, ions and neutrals is increased. For example, it has been found that reducing the flow rate of 58% 72GeF4 by 30% or more in comparison to its corresponding lesser enriched version of 51% causes the ions source tool to destabilize as a result of reduced pressure in the ion source tool. Even if the plasma is sustained, the user may observe considerable drop in beam current due to reduced plasma efficiency. Generally speaking, it has been observed that the lower limit for the flow rate should not fall below about 0.5 sccm when using any type of enriched dopant gas.

Additionally, a reduced flow rate of enriched dopant gases under reduced pressure causes the walls of the arc chamber to become hotter. Less gas occupies the arc chamber at any given time of the process, thereby reducing the cooling effect of the gas. As a result, the reaction rate of the halogen cycle significantly increases, as active fluorine can more rapidly etch and erode the tungsten chamber walls at higher temperatures.

The present invention recognizes and takes into account the above process limitations to offer unique solutions for using enriched dopant gases for ion implantation. As will now be described in detail in various embodiments, the present invention utilizes various approaches to lower the total power level input to the ion source by a controlled amount when ion implanting enriched and highly enriched dopant gases.

In a first embodiment of the present invention, the ion implantation process can be operated by reducing the total input power to the ion source. The reduced total input power level is lower in comparison to the total power level employed with a corresponding lesser enriched or non-enriched dopant gas. As used herein and throughout the specification, the phrase "reduced total power level" means the total power level input to the ion source that is associated with ion implanting an enriched dopant gas at a given flow rate to produce a beam current substantially similar to that produced using a correspondingly lesser enriched or non-enriched dopant gas at the same flow rate. The flow rate of the enriched dopant gas is intended to remain substantially the same as the flow rate of the lesser enriched or non-enriched dopant gas to ensure at least a minimum pressure is achieved and maintained which is sufficient to sustain the plasma throughout the ion implantation process. In this manner, maintaining the gas flow rate avoids ion source instability. Generally speaking, the percentage by which the total power level is reduced relative to the power level employed with the corresponding lesser enriched or non-enriched dopant gas may range from 5 to 30%. The reduced total power level is selected so that the net total power input made available to the enriched dopant gas is reduced to a level that maintains substantially the same amount of generated dopant ions as when utilizing the lesser enriched or non-enriched dopant gas. Determination of a specific reduced total power level is a function of numerous variables, including the ionization efficiency of the specific dopant gas, its enrichment level and the flow rate.

By operating at a reduced total power level, the ionization efficiency of the enriched dopant gas is lowered a controlled amount to maintain substantially the same ion beam current as previously qualified with the non-enriched dopant gas. In other words, the reduced total power level that is input to the ion source, directly or indirectly, is designed to intentionally reduce the ionization efficiency of the enriched dopant gas. Ionization efficiency is dependent upon the number of electrons and the energy of electrons emitted from the cathode that collides and interacts with the enriched dopant gas. Because the enriched gas contains more dopant atomic species per unit flow volume, the number of generated enriched dopant ions at the reduced ionization efficiency remains identical or substantially similar to that when employing the lesser enriched or non-enriched gas. In this manner, the beam current as-qualified previously with the non-enriched or lesser enriched dopant gas is maintained.

In some applications, the ionization efficiency on average may be reduced as much as a factor of 3× in comparison to the corresponding lesser enriched or non-enriched dopant gas. The exact ionization efficiency will depend at least partially on the type of dopant gas and the level of enrichment of that dopant gas. The present invention is particularly advantageous when the enriched dopant gas is a fluorine-containing gas, as less free fluorine is introduced into the chamber, thereby reducing the adverse effects of the halogen cycle. For example, an ion implant process that utilizes a fluorine-containing dopant gas such as 72GeF4 in which the mass 72 germanium isotope is enriched from natural abundance levels of 27% to an enriched level of 70% may have an ionization efficiency that is reduced by a factor of 2.5× yet still retain the beam current as-qualified with the non-enriched GeF4.

Numerous means for reducing the input total power to an ion source are contemplated. In one embodiment, the power input to the source filament itself is reduced. In accordance with the principles of the present invention, at lower power levels, fewer electrons are emitted from the cathode, thereby resulting in less ionization of the enriched dopant gas. The user can control the amount of given ions produced during the process by preferably selecting a predetermined filament power at which the ion implantation is performed. The flow rate of the enriched dopant gas remains substantially the same as the flow rate of the non-enriched or lesser enriched dopant gas to ensure a minimum pressure sufficient to sustain the plasma. The filament power is reduced to reduce ionization efficiency of the enriched dopant gas, thereby maintaining the number of dopant ions generated from the higher enriched dopant gas similar to that of non-enriched or lower enriched dopant gas. As a result, the beam current remains unchanged. Typical filament power levels can range from 100-1000 W, preferably from 200-500 W and more preferably from 150-350 W. The optimal filament power level will vary, at least in part, on the specific dopant gas utilized in the ion implant process and the degree of enrichment of the dopant gas. For example, in one embodiment, under reduced power operation, the filament power can be maintained in the range of 175-350 W when ion implanting a highly isotopically enriched dopant gas of 72GeF4 at 58-75% enrichment at a flow rate unchanged from its lesser enriched or non-enriched analog.

Furthermore, in accordance with the principles of the present invention, operating the filament at a predetermined lower power is preferably carried out so as to reduce the temperature of the cathode and the corresponding number of electrons emitted from the cathode. A lower operating filament and cathode temperature directly lowers the temperature of the tungsten chamber walls of the ion chamber. Lower temperatures of the tungsten chamber walls effectively reduce the reaction kinetics of the halogen cycle. Specifically, the rate of tungsten wall etching that is occurring by reaction of active fluorine to form volatile WFx species is reduced at the lower temperatures. The net amount of volatile WFx species generated in the plasma phase is reduced by significant reduction of chamber wall erosion. At such reduced filament and cathode temperatures, the rate of WFx reduction to re-deposit W onto the surface of the cathode is reduced. Hence, the slower reaction kinetics of the halogen cycle minimizes tungsten deposits on the filament, thereby extending the ion source life, while still maintaining the same beam current as previously qualified with the non-enriched or lesser enriched dopant gas. Fluorine attack of chamber wall and W re-deposition on the cathode can short the ion source life. Thus, operating under lower power that is sufficient to reduce the operating filament temperature and create reduced ionization efficiency can improve and extend the ion source life, while beneficially still providing the same beam current as qualified with the non-enriched or lesser enriched dopant gas.

The present invention utilizes the relationship between the temperature of the source filament and the number of emitted electrons from the cathode to control the overall number of dopant ions that are generated. Specifically, the source filament is responsible for generating electrons that are accelerated towards the cathode or cathode cup to increase the temperature to its thermionic emission temperature. The electrons generated from the cathode interact and collide with the isotopically enriched dopant gas introduced into the arc chamber to produce different ions and neutrals. For example, in the case of GeF4 that is enriched in one of its particular stable isotopes, the generated ions and neutrals may include Ge+, F+, GeF2+, GeF+, F2+, Ge, F, GeF2 and the like. The emission current density from a hot cathode (i.e., the number of electrons which can be produced and emitted from the cathode) is related to its temperature by the Richardson-Dushman equation, shown below:

$$J_e = AT^2 \exp(-\phi//kT) \quad (1)$$

Where $J_e$=electron emission current density having units of amps/cm$^2$;
A=constant (120 amps/cm$^2$/K$^2$);

T=temperature of cathode having units of K;
φ=Cathode work function having units of eV; and
k=Boltzmann constant (11,600 eV/K).

The above equation shows that the number of electrons which can be produced and emitted from the cathode (i.e., emission current density) is directly related to the temperature of the cathode, which is heated by the source filament. By lowering the temperature of the cathode, fewer electrons are generated in the manner shown above, which translates into less overall enriched dopant gas ions being produced from interaction and collision with the generated electrons from the cathode. In this manner, the present invention recognizes that reducing the power level and temperature of the source filament produces less dopant gas ions so as to maintain the same beam current in comparison to that produced with a correspondingly lesser enriched or non-enriched dopant gas.

Reduced cathode temperatures translates into lower operating temperatures of the ion source chamber walls. Typical ranges for the operating temperatures of the ion source chamber walls in the coldest region and the hottest region can range anywhere from 500 C to 1100 C, respectively. In an alternative embodiment, the temperature can range from 400 C to 900 C. Generally speaking, higher enrichment levels of the dopant gas will require lower ionization efficiencies (i.e., less energy to ionize a given flow rate of enriched dopant gas) to maintain the beam current as previously qualified, thereby reducing the temperature of the ion source. The optimal temperature will vary, at least in part, on the specific dopant gas utilized in the ion implant process, the degree of enrichment of the dopant gas and the known reaction kinetics for the halogen cycle. For example, in one embodiment, under a predetermined reduced power setting as described above, the reduced operating temperature from coldest to hottest region can be maintained in the range of 400 C to 900 C, respectively, when ion implanting a highly isotopically enriched dopant gas of 72GeF4 at about 75% enrichment for a given flow rate that is unchanged from utilizing a correspondingly lesser enriched level of the dopant gas. The lower temperature of the tungsten chamber walls reduces the rate of the halogen cycle, thereby extending the ion source life.

Other means for reducing total power to the ion source are contemplated by the present invention. By way of example, in an alternative embodiment, a similar effect of operating under a lower cathode temperature can be achieved by reducing the bias voltage between the filament and the cathode. The flow rate of the enriched dopant gas remains substantially the same as the flow rate of the non-enriched dopant gas to ensure a minimum pressure sufficient to sustain the plasma. The bias voltage can range between 100V-600V. In another embodiment the bias voltage can be reduced to range between 100V-575V, or, alternatively, 100V-550V.

In yet another embodiment of the present invention, the arc voltage in the ion chamber can be lowered a predetermined amount to reduce total power input to ion source. "Arc voltage" as used herein is defined as the potential difference between the cathode and the chamber wall. By reducing the arc voltage by a predetermined amount, the energy imparted to the electrons generated from cathode is reduced. A suitable reduction of the arc voltage by a predetermined amount preferably lowers the ionization efficiency of the plasma. In this embodiment, a lower ionization efficiency of the plasma results in fewer ions generated and reduced energy for each of the generated ions. While the amount of dopant ions produced from the highly enriched dopant gas is maintained substantially equal to the number of corresponding dopant ions produced from a corresponding non-enriched or lower enriched dopant gas, the net amount of active fluorine generated (including ions and neutrals) is less. Because fluorine is a precursor for occurrence of the halogen cycle, a lower fluorine concentration in the plasma phase results in less occurrence of the halogen cycle, thereby improving and extending the ion source life. Arc voltages of the present invention can range from 50V-150V. In another embodiment, the arc voltage can range from 50V-140V. In yet another embodiment, the arc voltage can range from 50V-120V or 70V-110 V. Suitable arc voltages will be determined at least in part based on the type of dopant gas and its enrichment level. Generally speaking, lower operating arc voltages are possible at higher enrichment levels of the dopant gas.

In accordance with the principles of the present invention, for a given flow rate, the net total power supplied to the enriched dopant gas is determined from the arc voltage, arc bias and input power to the filament source. Careful selection of each of the three operating parameters for a given flow rate in accordance with the present invention enables extended ion source life to be achieved utilizing various enriched dopant gases. For example, one of the three parameters may be reduced to lower the overall total power. Alternatively, each of the three parameters may be slightly reduced to lower the overall total power. In both examples, the total power level can be reduced in comparison to the total power level utilized for a corresponding lesser enriched or non-enriched dopant gas. The reduction in net total power reduces ionization efficiency of the enriched dopant gas to maintain a beam current as would have been produced using the correspondingly lesser enriched or non-enriched dopant gas, whereby the flow rates of the non-enriched and enriched dopant gases in both instances remain unchanged.

Various dopant gases may used to carry out the present invention. Illustrated dopant gases include BF3, GeH4, B2H6 and BCl3. Other dopant gases containing multiple stable isotopes may also be used. In a preferred embodiment, the dopant gas is a fluorine-containing gas, such as GeF4, for implanting Ge ions. Any enrichment level of the Ge dopant species is contemplated. Examples of possible enrichments levels include, but are not limited to, 72GeF4 greater than 50%, greater than 55%, greater than 60%, greater than 70%, greater than 80% or greater than 90%. Enriched GeF4 and other isotopically enriched dopant gases are commercially available from various manufacturing suppliers, such as Urenco®. The enrichment level of the GeF4 or other dopant gas that is used is based on a combination of parameters, some of which may include the flow rate of the dopant gas, the required implant dosage level, the minimum flow rate required to maintain stability of the ion source as well as the operating total power level and temperature of the cathode. For a given enrichment level of GeF4, in order to maintain a beam current that does not deviate from previously qualified levels, total power and ion source temperature preferably should be reduced a predetermined amount in comparison to the levels utilized when operating with a correspondingly lesser enriched or non-enriched dopant gas.

In regards to enriched GeF4 and other fluorine-containing gases, operating the filament or cathode at a lower temperature lowers the temperature of the tungsten chamber walls, thereby reducing the attack of the chamber walls via the active fluorine ions. As a result, less WFx species are generated into the plasma phase. Additionally at reduced cathode temperatures, the kinetic rate of WFx reduction to re-deposit W on the cathode is also reduced. Less overall WFx re-deposits as elemental W onto the cathode source filament, thereby causing the ion source life to be extended.

In one embodiment, the 72GeF4 is selected at an enrichment level between 55% and 70%. Given 72GeF4 at an enrichment level of 55% to 70%, and maintaining the same range of flow rates as utilized with the corresponding non-enriched dopant gas (e.g., a flow rate ranging from 1 to 3 sccm), the percentage by which the power level can be reduced is 5-20% in comparison to the input total power level utilized for the corresponding lesser enriched or non-enriched dopant gas. Generally speaking, higher enrichment levels will require greater reduction in power level to decrease the ionization efficiency of the enriched dopant gas. Alternatively, 72GeF4 having an enrichment in 72Ge at 55-60% can be utilized in which the input total power level is reduced by 5-15% in comparison to the input total power level utilized for the corresponding lesser enriched or non-enriched 72GeF4 dopant gas when the flow rate is in a range of 1-3 sccm. In still another embodiment, when flowing 1-3 sccm of 72GeF4 enriched at about 58% into the ion chamber, the input total power level may be reduce by operating with a reduction in input power to the source filament that can range from about 200 to 400 W, preferably 200 to 375 W, and more preferably 200 to 350 W.

In another embodiment, the 72GeF4 is selected at an enrichment in 72Ge at 58% or greater, a reduced filament power level of 200-500 W is selected such that the chamber walls have a reduced temperature ranging from 400 C to 900 C and the flow rate is in a range of 1 sccm to 3 sccm.

In another embodiment, highly enriched levels of 72GeF4 can be selected in accordance with the principles of the present invention. For example, an enrichment level greater than 70% and below 80% may be used. Ion implanting 72GeF4 at an enrichment level between 70% and 80%, and maintaining the same range of flow rates (e.g., 1 to 3 sccm) as utilized with the correspondingly non-enriched or lesser enriched GeF4 dopant gas into the ion source chamber, the percentage by which the power level can be reduced may be 20%-30%. The actual power supplied to the source filament may range from about 175-350 W, preferably 175-325 W, and more preferably 175-300 W.

The reduced power level is preferably selected so as to maintain sufficient energy to impart adequate ionization of the enriched 72GeF4 to achieve the required implant dosage of 72Ge, but yet low enough to lower chamber wall and source filament temperature in the manner such that the halogen cycle effects are minimized. As a result, undesired deposits in the ion source chamber by the halogen cycle can be reduced when using the enriched 72GeF4. Unlike conventional processes, the present invention allows the ion source life to be extended when using higher enriched dopant gases without having to reduce the flow rate of the enriched dopant gases.

It should be understood that if reduced gas consumption is a primary design objective, a reduced flow rate of isotopically enriched dopant gas may be introduced into the chamber in combination with a stabilizing gas. Illustrative examples of a stabilizing gas include but are not limited to argon, krypton, xenon, hydrogen, various other inert gases and any combination thereof. The stabilizing gas increases the total minimum flow rate of gas to at least the minimum threshold required for maintaining a minimum pressure in the ion source to sustain the plasma. In response to the lower flow rate of enriched dopant gas introduced into the chamber, the total power level input to the ion source may be set slightly higher than described in the previous embodiments in which the flow rate for the identically enriched dopant gas (e.g., 58% 72GeF4) is not reduced. In this manner, the relatively slightly higher power increases the ionization efficiency of the dopant gas (e.g., 58% 72GeF4) in a controller manner to offset the reduced number of 72Ge dopant species introduced into the chamber by virtue of the reduced flow rate. As such, the total number of 72Ge ions that is produced remains constant, enabling the beam current as qualified to be achieved and maintained during the ion implantation process. Such a technique allows less gas consumption for carrying out the equivalent implant dosage. In one example, 0.7 sccm 72GeF4 at an enrichment level of 58% in mass 72Ge can be co-flowed with 0.3 sccm of a stabilizing gas (e.g., argon) at a power level slightly increased (e.g., 1-10%) in comparison to the reduced power level used for 58% 72GeF4 at 1 sccm without a stabilizing gas. Alternatively, the power level when ionizing 0.7 sccm of 58% 72GeF4 with 0.3 sccm of inert gas may be increased to a level that is substantially the same power level employed with a corresponding lesser enriched 72GeF4 of for example, 50%, that is introduced at about 1 sccm into the chamber, such that the 72Ge ions are generated in the same amounts in both instances. The specific combination of various key design variables, including but not limited to selection of dopant gas, enrichment level of dopant gas, flow rate of enriched dopant gas, selection of stabilizing gas, flow rate of stabilizing gas, temperature of the ion source chamber and total power level inputted to the ion source may affect the ion source life.

In accordance with the principles of the present invention, the flow rate for the enriched dopant gas without a stabilizing gas should be maintained at or above at least a lower limit to maintain ion source stability, but should not exceed an upper limit beyond which the pressure in the ion source chamber becomes unreasonably high, such that recombination reactions can occur. Specifically, the dopant ions tend to recombine to form the neutral phase compounds. The net effect can be an overall reduced number of generated ions, which proportionally translates into reduced beam current available for implantation to achieve the required dosage. Additionally, if the enriched dopant gas is a fluorine-containing gas such as 72GeF4, operating at a flow rate that exceeds an upper limit introduces excessive fluorine into the ion chamber, thereby worsening the halogen cycle effects and shortening the source life. Generally speaking, the upper limit for the flow rate should not exceed 5 sccm. Operating at or below 5 sccm can suppress acceleration of the halogen cycle effects if a fluorine-containing gas is employed. Accordingly, the optimal ion implantation process preferably employs flows enriched levels of a dopant gas equal to or greater than 1 sccm to overcome ion source instability and at or below 5 sccm to avoid recombination reactions and beam current reduction. In a preferred embodiment, the flow rate ranges between 1 to 3 sccm for 72GeF4 enriched in 72Ge at 75% or greater when operated at reduced power levels as described. Selection of a suitable flow rate of the enriched gas between the lower and the upper flow rates will be dependent upon the specific ion implantation process itself, including the various aforementioned key process parameters.

It should be understood that any sub-atmospheric storage and vacuum actuated delivery device can be utilized to store and deliver the enriched dopant gas. In a preferred embodiment, the Uptime® delivery device, commercially available by Praxair® and as disclosed in U.S. Pat. Nos. 5,937,895; 6,045,115; 6,007,609; 7,708,028; and 7,905,247, all of which are incorporated herein by reference in their entirety, may be employed in the present invention to safely deliver a controlled flow rate of the enriched dopant gas to an ion source. When the pressure condition attains a sub-atmospheric condition, the delivery device allows the confined enriched dopant gas to flow from the cylinder through the fluid discharge line and into the ion apparatus.

Figure 2:
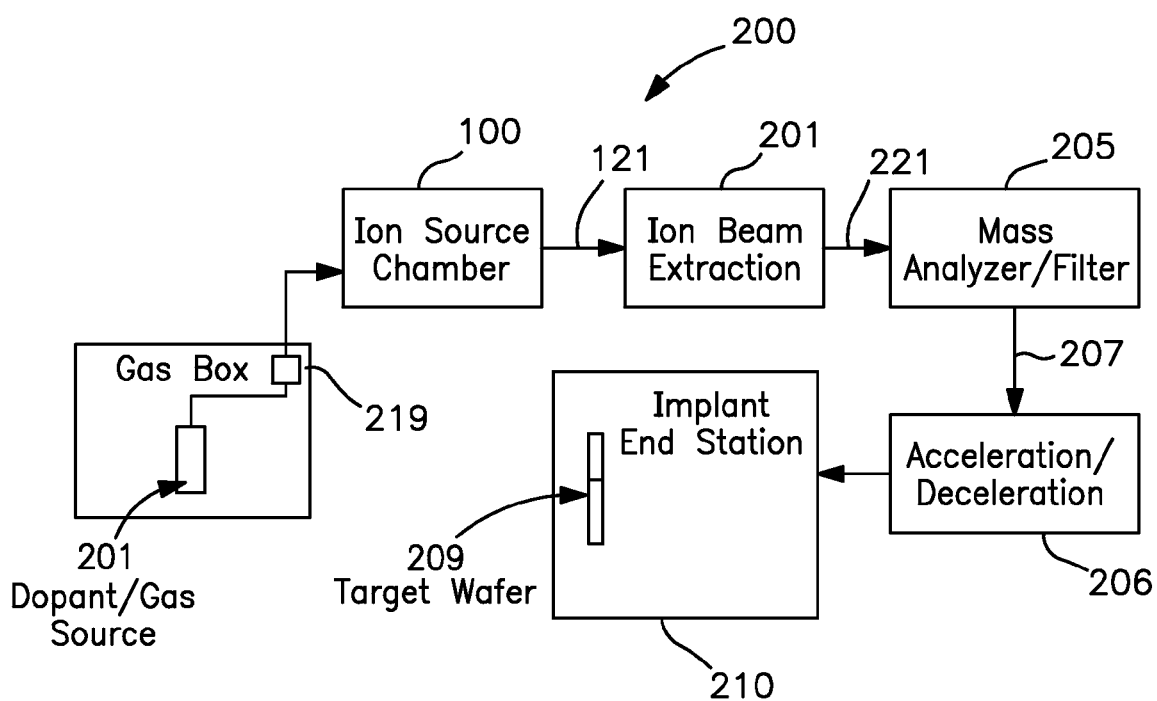
FIG. 2 shows the ion source apparatus of FIG. 1 incorporated into a beam line ion-implant system.

With reference to FIGS. 1 and 2, an exemplary ion implantation apparatus 100 in accordance with the principles of the present invention is shown. Specifically, in one example, the ion source apparatus 100 of FIG. 1 can be used for producing an electron beam for implanting 72Ge ions into a semiconductor substrate. 72Ge ions are generated from ionization of enriched 72GeF4 at 55% or greater 72Ge. The enriched 72GeF4 is preferably introduced from a sub-atmospheric storage and delivery container 201 (FIG. 2) into the chamber 103 through inlet line 113 as stream 102. Stream 102 can be introduced at a flow rate ranging from about 1-5 sccm, or more preferably 1-3 sccm. The total power level input to the ion source 100 is reduced in comparison to the total power level utilized with a lesser enriched or non-enriched GeF4 dopant gas. Generally speaking, utilizing higher enriched levels of 72GeF4 will require the total power level input to the ion source 100 to further decrease to allow a reduction in the number of generated 72Ge ions per unit flow into the chamber 113.

The ion source 100 depicted in FIG. 1 has various components, including source filament 114 an indirectly heated cathode (IHC) 115 which serves as the ion source for ionizing the enriched 72GeF4 into its corresponding ions. It should be understood other suitable types of ion sources known in the art can be employed, including, for example, the Freeman sources, Bernas sources and RF plasma sources.

The power supply source (not shown) resistively heats tungsten-based filament 114 positioned in close proximity to the cathode 115. The filament 114 may be negatively biased relative to the cathode 115. A current is applied to the filament 114 through the power supply source to resistively heat the filament 114. An insulator 118 is provided to electrically isolate the cathode 115 from the arc chamber wall 111. The reduced power level is preferably selected to lower the temperature of the cathode 115 yet maintain adequate ionization of the enriched 72GeF4 to achieve the required implant dosage of 72Ge. Ion chamber 112 walls and source filament 114 temperature are also reduced, thereby mitigating the adverse effects of the halogen cycle.

The reduced power and temperature causes fewer electrons to be generated from the cathode 115 which translates into less overall 72Ge ions being produced from interaction and collision with the generated electrons from the cathode 115. The cathode 115 also produces less electrons which are of lower energy. In this manner, the same beam current can be produced as with a correspondingly lesser enriched GeF4 (e.g., 72Ge enriched at 50-52% from enriched GeF4) or non-enriched GeF4 (i.e., 72Ge naturally occurring at 27% natural abundance levels from non-enriched GeF4) whereby the life of the ion source 100 is extended as a result of less free fluoride ions generated in the chamber 113 and lower temperatures therein along the tungsten chamber walls.

Still referring to FIG. 1, the emitted electrons from the cathode 115 accelerate and ionize the enriched 72GeF4 to produce a plasma environment within the chamber 112. The flow rate of 1-3 sccm is sufficiently high enough to maintain stability of the plasma in the chamber 112 during the ion implant process. The repeller electrode 116 builds up a negative charge to repel the electrons back towards the enriched 72GeF4 to collide therewith and sustain ionization of the enriched 72GeF4. In this manner, the plasma environment is maintained in the arc chamber 112 at a pressure that remains sufficient to maintain stability of the ion source 100.

Repeller electrodes 116 are preferably configured substantially diametrically opposed to the cathode 115 to maintain ionization of the enriched 72GeF4 within the chamber 112. The arc chamber wall 111 includes an extraction aperture 117 through which a well defined ion beam 121 is extracted from out of the arc chamber 112. The extraction system includes extraction electrode 120 and suppression electrode 119 positioned in front of the extraction aperture 117. Both the extraction and suppression electrodes 120 and 119 have respective apertures aligned with the extraction aperture 117 for extraction of the well-defined ion beam 121.

FIG. 2 shows the ion source apparatus 100 of FIG. 1 incorporated into a beam line ion-implant system 200. The enriched 72GeF4 at 55% or greater is introduced from gas box 201. The enriched 72GeF4 is introduced into an ion source chamber 100 where energy is introduced into the chamber to ionize the 72GeF4 as has been described. Flow control device 219 which includes mass flow controllers and valves is used to control the flow of the enriched dopant gas at the desired flow rate of 1-3 sccm.

Upon generation of the desired 72Ge ion beam at the desired current which is maintained similar to the beam produced from a lesser enriched 72GeF4 or non-enriched GeF4, an ion beam extraction system 201 is used to extract the ions from the ion source chamber 113 in the form of an ion beam 121 of desired energy. Extraction can be carried out by applying a high voltage across extraction electrodes. The extracted beam 221 is transported through a mass analyzer/filter 205 to select the 72Ge species to be implanted. The filtered ion beam 207 can then be accelerated/decelerated 206 and transported to the surface of a target workpiece 209 positioned in an end station 210 for implantation of the 72Ge dopant atomic species into the workpiece 209. The 72Ge ions of the beam collide with and penetrate the surface of the workpiece 209 at a specific depth to form a region with the desired electrical and physical properties.

In an alternative embodiment, the enriched 72GeF4 at 55% or higher enrichment is introduced at a flow rate ranging from about 1-3 sccm whereby the bias between the filament 114 and the cathode 115 is reduced. The bias voltage can range between 100V-600V. In this manner, the net ionization energy imparted to the enriched GeF4 dopant gas 103 in chamber 113 is reduced to generate the desired number of 72 Ge ions to maintain the as-qualified beam current. Furthermore, the reduced bias voltage creates a lower temperature of the cathode 115, thereby reducing the adverse effects of the halogen cycle.

In yet an alternative embodiment, the arc voltage in the ion chamber 113 can be lowered a predetermined amount. Specifically, the potential difference between the cathode 115 and the chamber wall 111 is reduced. In one embodiment, the arc voltage of the present invention can range from 50V-150V. By reducing the arc voltage by a predetermined amount, the energy imparted to the electrons generated from cathode 115 is reduced. A suitable reduction of the arc voltage preferably lowers the ionization efficiency of the plasma to maintain the amount of 72Ge ions substantially equal to the number of corresponding 72Ge ions produced from a corresponding non-enriched or lesser enriched 72GeF4. In this manner, the net amount of active fluorine generated (including ions and neutrals) is less, resulting in less occurrence of the halogen cycle, thereby improving and extending the ion source life.

Alternatively, it should be understood that any combination of arc bias, arc voltage and the input power to the cathode 115 may be reduced to lower the overall total power input to the ion source 100. The reduction in total power level enables users to realize the process benefits of ion implanting enriched and highly enriched dopant gases.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A method of using an enriched dopant gas, comprising:
introducing the enriched dopant gas at a flow rate sufficient to maintain stability of the ion source, wherein the enriched dopant gas has an enrichment level in an isotope therein of 90% or greater than natural abundance levels;
operating at a reduced total power level of the ion source in comparison to a total power level utilized for a correspondingly lesser enriched or non-enriched dopant gas; and
ionizing the enriched dopant gas to generate and maintain a beam current as produced using the correspondingly lesser enriched or non-enriched dopant gas at the flow rate.

2. The method of claim 1, further comprising:
operating the ion source at a reduced temperature in comparison to the correspondingly lesser enriched or non-enriched dopant gas at the flow rate; and
operating at the reduced total power level by reducing arc voltage, arc bias, filament power or a combination thereof.

3. The method of claim 1, further comprising maintaining the stability of the ion source by introducing the enriched dopant gas at a flow rate equal to or greater than 1 sccm.

4. The method of claim 3, wherein the enriched dopant gas comprises 72GeF4 at an enrichment level in 72Ge of at least 55%.

5. The method of claim 1, further comprising the step of avoiding recombination reactions by maintaining the flow rate at or below 5 sccm.

6. The method of claim 1, wherein the step of operating at the reduced total power level comprises lowering an ionization efficiency of the enriched dopant gas in a controlled amount to maintain substantially the same ion beam current as previously qualified with the lesser enriched or the non-enriched dopant gas.

7. The method of claim 1, further comprising the steps of:
operating the ion source with enriched 72GeF4 comprising at least 75% enrichment in 72Ge;
operating at a reduced temperature in comparison to the corresponding lesser enriched or non-enriched 72GeF4 dopant gas at the flow rate, wherein the temperature of the ion source chamber walls range between 400 C to 900 C; and
reducing the bias between a filament and the cathode of the ion source.

8. The method of claim 1, wherein the step of operating at the reduced total power level occurs by operating at a lower arc voltage in the ion chamber by a predetermined amount.

9. A method of using an enriched dopant gas, comprising:
introducing the enriched dopant gas at a flow rate in a range of 1 to 5 sccm, wherein the enriched dopant gas consists essentially of 72GeF4 having an enrichment level in an isotope of 72Ge greater than 55%;
operating at a reduced total power level in comparison to a total power level utilized for a correspondingly lesser enriched or non-enriched dopant gas;
operating at a reduced temperature of the ion source in comparison to the corresponding lesser enriched or non-enriched dopant gas at the flow rate; and
ionizing the dopant gas to maintain a beam current as produced using a corresponding lesser enriched or non-enriched GeF4 at the flow rate.

10. The method of claim 9, further comprising operating the ion source whereby ion chamber walls have a reduced temperature ranging from 400 C to 900 C in comparison to the corresponding lesser enriched or non-enriched GeF4 at the flow rate by reducing the bias voltage between a filament and a cathode of the ion source.

11. The method of claim 9, wherein the step of operating at the reduced power level occurs by operating at a lower arc voltage, lower arc bias, lower filament power or a combination thereof.

12. The method of claim 9, wherein the enriched dopant gas consists essentially of 72GeF4 having a highly enriched level in an isotope of 72Ge of 75% or greater.

13. A method for using a highly isotopically enriched dopant gas for an ion implant process, comprising the steps of:
selecting a dopant gas having an atomic species to be implanted into a wafer;
selecting a mass isotope of said atomic species to be enriched at least 90% above natural abundance levels therein;
providing the enriched mass isotope of said dopant gas in a sub-atmospheric storage and delivery container;
introducing the enriched mass isotope of said dopant gas at a flow rate sufficient to maintain stability of the ion source;
operating at a reduced total power level of the ion source in comparison to a total power level utilized for a corresponding lesser enriched or non-enriched dopant gas; and
ionizing the enriched mass isotope of the dopant gas to maintain a beam current as produced using the corresponding lesser enriched or non-enriched dopant gas at the flow rate.

14. The method of claim 13, wherein the flow rate does not exceed an upper limit at which recombination reactions occur.

15. The method of claim 13, wherein the ion source is at a reduced temperature in comparison to the corresponding non-enriched dopant gas at the flow rate.

16. The method of claim 13, wherein the enriched dopant gas is 72GeF4 having an enrichment in 72Ge at 55-60%.

17. The method of claim 13, wherein the enriched dopant gas is 72GeF4 having an enrichment in 72Ge at 55-70% and the reduced total power level is reduced by 5-20% in comparison to the total power level utilized for the corresponding lesser enriched or non-enriched 72GeF4 dopant gas at a flow rate of about 1-3 sccm.

18. The method of claim 13, wherein the enriched dopant gas is 72GeF4 having an enrichment in 72Ge at a range of 70-80%, the reduced total power level being 20-30% lower than the power level utilized for the corresponding lesser enriched or non-enriched 72GeF4 dopant.

19. The method of claim 13, wherein the enriched dopant gas is 72GeF4 having an enrichment in 72Ge at 58% or greater, a reduced filament power level is in a range of 200-500 W, the chamber walls have a reduced temperature ranging from 400 C to 900 C and the flow rate is in range of 1 sccm to 3 sccm.

20. The method of claim 19, further comprising operating at a lower arc voltage in the ion chamber while maintaining the power input to the filament and arc bias unchanged so as to reduce the total power level in comparison to the total power level utilized for the corresponding lesser enriched or non-enriched dopant gas.

* * * * *